United States Patent [19]

Goldman et al.

[11] Patent Number: 4,463,491
[45] Date of Patent: Aug. 7, 1984

[54] METHOD OF FABRICATING A MONOLITHIC INTEGRATED CIRCUIT STRUCTURE

[75] Inventors: Ernest A. Goldman, Stow; Jeremiah P. McCarthy, Framingham; Paul E. Poppert, Acton, all of Mass.

[73] Assignee: GTE Laboratories Incorporated, Waltham, Mass.

[21] Appl. No.: 371,325

[22] Filed: Apr. 23, 1982

[51] Int. Cl.³ .................. H01L 21/82; H01L 21/88; H01L 21/225
[52] U.S. Cl. .................. 29/571; 29/577 C; 148/187; 148/188; 357/23; 357/67
[58] Field of Search .................. 357/42, 59, 71 S, 86; 29/571, 576, 577 C; 148/187

[56] References Cited

U.S. PATENT DOCUMENTS

| | | | |
|---|---|---|---|
| 4,069,067 | 1/1978 | Ichinohe | 148/187 |
| 4,280,272 | 7/1981 | Egawa et al. | 357/42 |
| 4,333,099 | 6/1982 | Tanguay et al. | 357/67 |

Primary Examiner—Aaron Weisstuch
Assistant Examiner—Hunter L. Auyang
Attorney, Agent, or Firm—David M. Keay

[57] ABSTRACT

Method of fabricating a monolithic integrated circuit structure incorporating complementary metal-oxide-silicon field effect transistors (CMOS FET's) including providing a body of silicon produced by conventional techniques having a sector of N-type and a sector of P-type each covered by a thin silicon oxide layer and a thin silicon nitride layer. The regions of the body adjacent to each of the sectors are covered by a thicker silicon oxide field layer. Portions of the thin nitride and oxide layers are removed to expose spaced apart zones in each of the sectors. Adherent contact members of low resistivity polycrystalline silicon of N and P-type conductivity are formed in contact with the exposed surfaces of the zone in the P and N-type sectors, respectively. Where N and P-type contact members are contiguous a rectifying junction is produced. The surfaces of the polycrystalline contact members are metallized with a highly conductive material, thereby shorting out the rectifying junctions. P-type conductivity imparting material is implanted through a gate oxide layer into the N-type sector except the portion shielded by a first gate electrode and the contact members. N-type conductivity imparting material is implanted through a gate oxide layer into the P-type sector except the portions shielded by a second gate electrode and the contact members. The body is heated to drive the implanted conductivity type imparting materials further into the sectors and to diffuse conductivity type imparting material from the contact members into the adjacent zones.

4 Claims, 4 Drawing Figures

METHOD OF FABRICATING A MONOLITHIC INTEGRATED CIRCUIT STRUCTURE

CROSS-REFERENCE TO RELATED APPLICATION

This application is related to application Ser. No. 371,326 filed concurrently herewith by Ernest A. Goldman, Jeremiah P. McCarthy, and Paul E. Poppert entitled "Monolithic Integrated Circuit Structure and Method of Fabrication" and assigned to the assignee of the present application.

BACKGROUND OF THE INVENTION

This invention relates to monolithic integrated circuit structures. More particularly, it is concerned with methods of fabricating complementary metal-oxide-silicon (CMOS) integrated circuit structures.

In integrated circuit structures polycrystalline silicon is frequently used to make ohmic connections to underlying active regions of single crystal silicon. Such polycrystalline connections are particularly useful when employed in conjunction with shallow junction devices because metallization techniques might produce metallic spikes which short out the junction.

In order to obtain proper ohmic connection, the polycrystalline material must be of the same conductivity type as the region of the single crystal material which it contacts. That is, N-type polycrystalline material must be used to contact N-type regions and P-type polycrystalline material must be used to contact P-type regions. Thus, for CMOS structures which have active regions of both N and P-type material both N and P-type polycrystalline material must be employed. A rectifying junction is formed where the two types of polycrystalline material meet. The rectifying junctions must be shorted out by overlying conductive material.

Thus, it is desirable that techniques of fabricating integrated circuit structures of the CMOS type permit the utilization of polycrystalline connections of both conductivity types together with suitable metallization to short out junctions. In addition the techniques should permit precise control of the channel regions and of the gate electrode structures of the MOS field effect transistors (FET's).

SUMMARY OF THE INVENTION

An improved method of fabricating monolithic integrated circuit structures in accordance with the present invention comprises providing a body of semiconductor material having a first section of one conductivity type inset at a surface of the body and a second section of the opposite conductivity type inset at the surface of the body. An adherent layer of protective material is formed on the surface of the body with a first opening therein exposing a portion of the first section and a second opening therein exposing a portion of the second section. An adherent member of semiconductor material of the one conductivity type of low resistivity is then formed on the exposed portion of the second section and an adherent member of semiconductor material of the opposite conductivity type of low resistivity is formed on the exposed portion of the first section. The member of semiconductor material of the one conductivity type and the member of semiconductor material of the opposite conductivity type extend over portions of the layer of protective material and are contiguous at a junction. An adherent layer of highly conductive material is formed on and in ohmic contact with the member of semiconductor material of the one conductivity type of low resistivity and on and in ohmic contact with the member of semiconductor material of the opposite conductivity type of low resistivity in the regions in which they are contiguous, thereby shorting out the rectifying junction between them. Conductivity type imparting material of the one conductivity type is introduced into a region of the second section which includes the zone underlying the interface between the member of semiconductor material of the one conductivity type of low resistivity and the second section, thereby forming an ohmic connection therebetween. Conductivity type imparting material of the opposite conductivity type is introduced into a region of the first section which includes the zone underlying the interface between the member of semiconductor material of the opposite conductivity type of low resistivity and the first section, thereby forming an ohmic connection therebetween.

More specifically in fabricating a monolithic integrated circuit structure incorporating complementary metal-oxide-silicon field effect transistors (CMOS FET's) the method in accordance with the invention comprises providing a body of semiconductor material having a first section of one conductivity type and a second section of the opposite conductivity type at a surface of the body. A first sector within the first section and a second sector within the second section are covered by an adherent coating of insulating material. The portions of the surface of the body contiguous with the first and second sectors are covered by an adherent field layer of insulating material which is thicker than the coating of insulating material. Portions of the coating of insulating material are removed to form openings exposing first and second spaced apart zones in the first sector and first and second spaced apart zones in the second sector. Adherent contact members of semiconductor material of the one conductivity type of low resistivity are then formed on the surfaces of the exposed first and second zones in the second sector, and adherent contact members of semiconductor material of the opposite conductivity type of low resistivity are formed on the surfaces of the exposed first and second zones in the first sector. The contact members extend over portions of the adjacent coating and the field layer of insulating material, and one of the contact members of semiconductor material of the one conductivity type is contiguous with one of the contact members of semiconductor material of the opposite conductivity type at a junction. An adherent layer of highly conductive material is formed on and in ohmic contact with the one contact member of semiconductor material of the one conductivity type and on and in ohmic contact with the one contact member of semiconductor material of the opposite conductivity type in the regions of the contact members in which they are contiguous, thereby shorting out the rectifying junction between them. Next, the coating of insulating material is removed from the first and second sectors except the portions underlying the adherent contact members of semiconductor material, thus exposing portions of the first and second sectors. An adherent gate layer of insulating material is placed on the exposed portions of the first and second sectors. Then a first gate member of semiconductor material of low resistivity is placed over a portion of the gate layer of insulating material overlying a channel region of the first sector. The channel region lies between two source/drain regions of the first sector. A second gate member of semiconductor material of low resistivity is placed over a portion of the gate layer of insulating material overlying a channel region of the second sector. The channel region lies between two source/drain regions of the second sector. Conductivity type imparting material of the opposite conductivity type is introduced into the two source/drain regions of the first sector including the first and second zones in the first sector, and conductivity type imparting material of the one conductivity type is introduced into the two source/drain regions of the second sector including the first and second zones in the second sector.

In the figures the various elements are not drawn to scale. Certain dimensions are exaggerated in relation to other dimensions in order to present a clearer understanding of the invention.

For a better understanding of the present invention together with other and further objects, advantages, and capabilities thereof, reference is made to the following discussion and appended claims in connection with the above-described drawings.

DETAILED DESCRIPTION OF THE INVENTION

In fabricating a monolithic integrated circuit structure containing complementary metal-oxide-silicon field effect transistors (CMOS FET's) in accordance with the invention as illustrated in the figures a substrate of single crystal semiconductor material of one conductivity type is provided as a supporting structure. As is well-understood, the substrate is usually a slice or wafer of relatively large surface area upon which many identical circuit networks each including many devices are fabricated simultaneously. However, for purposes of illustration the fabrication of only two complementary FET's in a fragment of a slice will be shown and described. In the following description silicon is employed as the semiconductor material and the starting substrate is of N-type conductivity.

Figure 1:
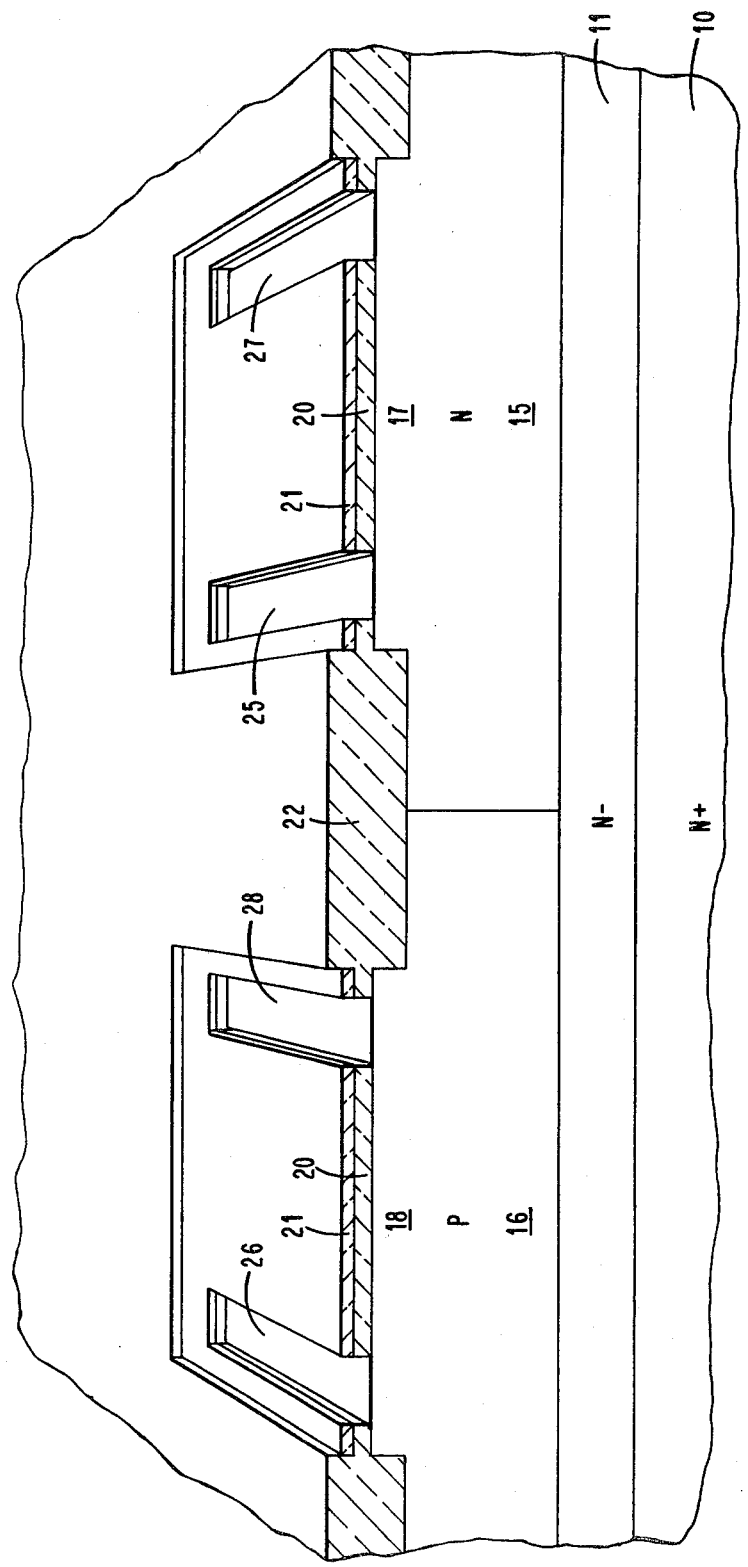
FIGS. 1-4 are a series of perspective views in crossection of a fragment of a wafer of silicon illustrating the fragment at various stages during the fabrication of complementary MOS FET's in accordance with the present invention.

A slice or wafer of N-type single crystal silicon of uniform resistivity having flat, planar, parallel, opposed major surfaces, a fragment 10 of which is illustrated in FIG. 1, is produced by any of the known techniques of crystal fabrication including appropriate slicing and cleaning operations. An epitaxial layer 11 of N-type silicon of uniform, moderate resistivity is grown on the surface of the substrate as by known vapor decomposition techniques. A layer 11 which is precisely controlled as to thickness and as to resistivity and which is a continuation of the crystalline structure of the single crystal substrate 10 is thus deposited on the surface of the substrate. The upper surface of the epitaxial layer 11 is parallel to the interface between the substrate and the layer.

Next, a layer of silicon oxide and a layer of silicon nitride are deposited on the surface of the layer. Silicon nitride is selectively removed in order to provide a suitable pattern through which phosphorus and boron are implanted so as to provide sections of N-type conductivity 15 and P-type conductivity 16. Known techniques of depositing silicon oxide and silicon nitride and of suitably masking and etching to remove the oxide and nitride in the desired patterns as well as known techniques of ion implanting conductivity type imparting materials are employed. After the sections 15 and 16 are formed, all the remaining nitride and oxide are removed leaving a bare surface on the silicon fragment. A thin layer of silicon oxide 20 is then deposited followed by the deposition of a thin silicon nitride layer 21. The silicon nitride is removed except at certain areas to define sectors 17 and 18 within the N and P-type sections 15 and 16, respectively. The slice is then treated in a suitable oxidizing atmosphere to grow silicon oxide so as to form a field oxide layer 22 except in the areas protected by silicon nitride. Next, by employing conventional masking and etching techniques, portions of the silicon nitride layer 21 and the thin silicon oxide layer 20 are selectively removed to provide openings 25 and 27 exposing portions of N-type sector 17 and openings 26 and 28 exposing portions of P-type sector 18. The techniques employed in fabricating the structure to the stage illustrated in FIG. 1 are well-known standard processing techniques widely used throughout the semiconductor industry.

Figure 2:
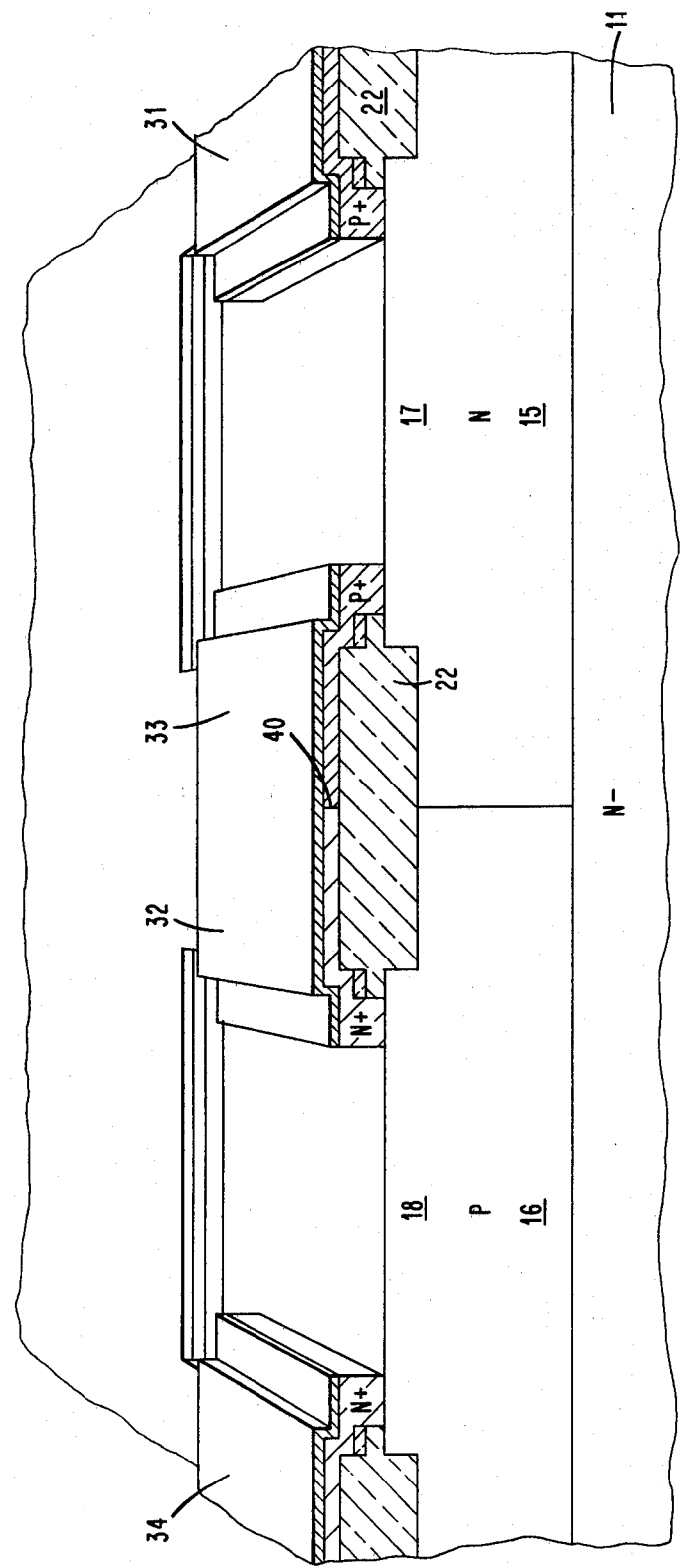

Polycrystalline silicon is deposited over the surface of the slice. The polycrystalline layer is suitably masked and N and P-type conductivity imparting materials are implanted in different portions to produce low resistivity material. The portions making contact with the N-type sector 17 through openings 25 and 27 are rendered P-type, and the portions making contact with the P-type sector 18 through openings 26 and 28 are rendered N-type. The surface of the polycrystalline silicon layer is then suitably metallized as by employing known techniques of forming a silicide of a refractory metal, for example tungsten or tantalum. Portions of the polycrystalline silicon layer and the metallized surface are then selectively removed to leave the resulting structure of polycrystalline contact members with metallized surfaces as shown in FIG. 2. The thin silicon nitride 21 and the silicon oxide 20 overlying the portions of the sectors 17 and 18 not shielded by the polycrystalline contact members are removed.

As shown in FIG. 2 a P-type polycrystalline silicon contact member 31 with overlying metallization is in contact with the N-type sector 17. Another P-type polycrystalline silicon contact member 33 with overlying metallization also is in contact with the N-type sector 17. N-type polycrystalline silicon contact members 32 and 34 with overlying metallization are in contact with the P-type sector 18. As can be seen in FIG. 2 two of the polycrystalline contact members 32 and 33 which extend over the field oxide 22 to interconnect regions of the final devices as will be apparent hereinbelow meet at a rectifying junction 40. The metallization on the surface of the contact members 32 and 33, however, is highly conductive thereby shorting out the rectifying junction 40.

Figure 3:
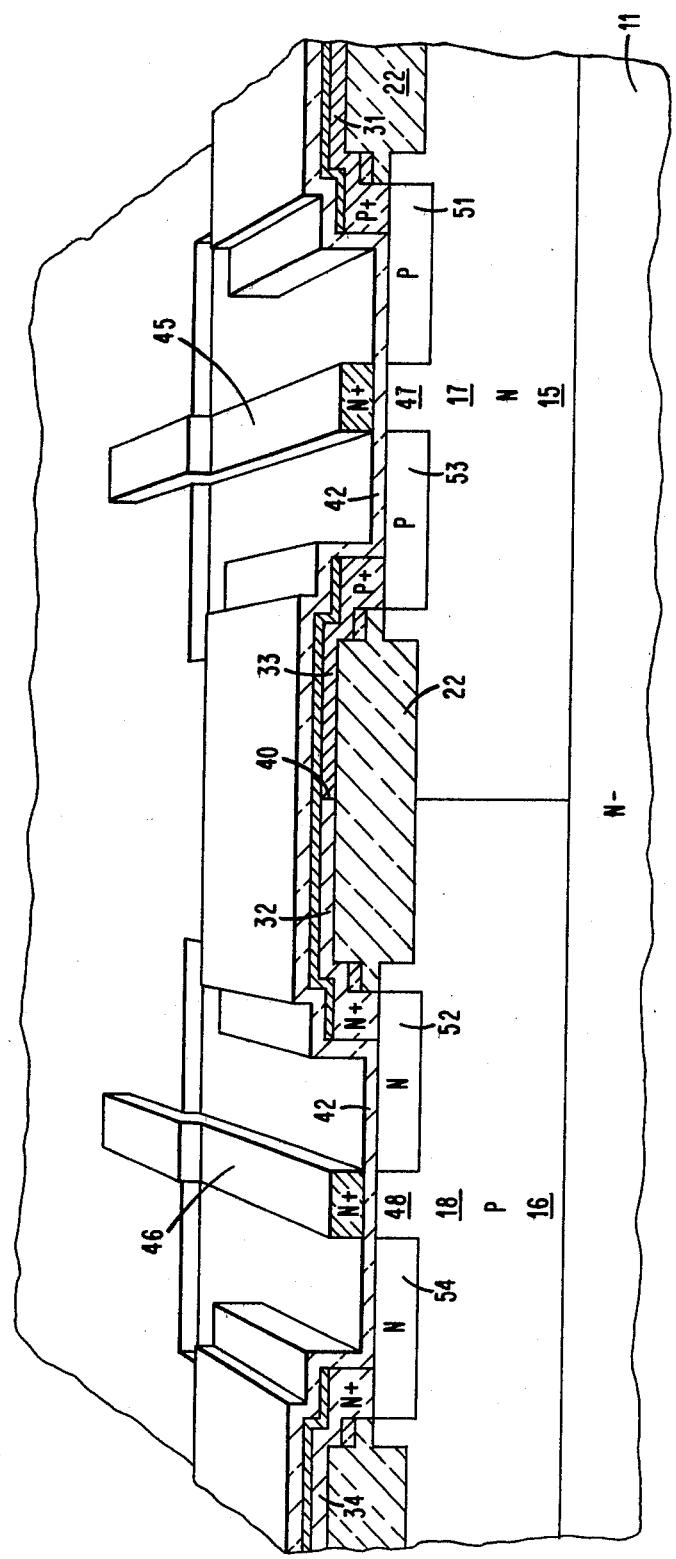

As shown in FIG. 3 a thin, carefully controlled silicon oxide gate layer 42 is then deposited over the surface of the slice providing the gate insulating structure on the exposed surfaces of the N and P-type sectors 17 and 18. A layer of polycrystalline silicon is deposited on the silicon oxide layer. The polycrystalline silicon is treated to introduce N-type conductivity imparting material to produce a polycrystalline silicon layer of low resistivity. Polycrystalline silicon of the layer is then removed by appropriate masking and etching techniques to produce gate electrodes 45 and 46 as shown in FIG. 3.

By employing conventional ion implantation techniques and masking as necessary P-type conductivity imparting material is introduced into the portions of the N-type sector 17 not shielded by the gate electrode 45 and the contact members 31 and 33. N-type conductivity imparting material is implanted into the portions of the P-type sector 18 not shielded by the gate electrode 46 and the contact members 32 and 34. The gate electrode 45 of low resistivity polycrystalline silicon defines and overlies a channel region 47 of N-type conductivity with insulating layer 42 between them. Similarly, gate electrode 46 defines a channel-region 48 of P-type conductivity between implanted N-type portions of the P-type sector.

The slice is then subjected to appropriate annealing steps to drive the implanted conductivity type imparting materials farther into their respective sectors as is well-known in the art. At the same time conductivity type imparting materials in the polycrystalline silicon contact members 31-34 diffuse into the zones of the sectors adjacent to their interface converting the conductivity type of the zones. After the diffusion the zones effectively extend to the ion implanted portions. Thus, P-type source/drain regions 51 and 53 in ohmic contact with contact members 31 and 33, respectively, are formed in the N-type sector 17, and N-type souce/drain regions 52 and 54 in ohmic contact with contact members 32 and 34, respectively, are formed in the P-type sector 18.

Figure 4:
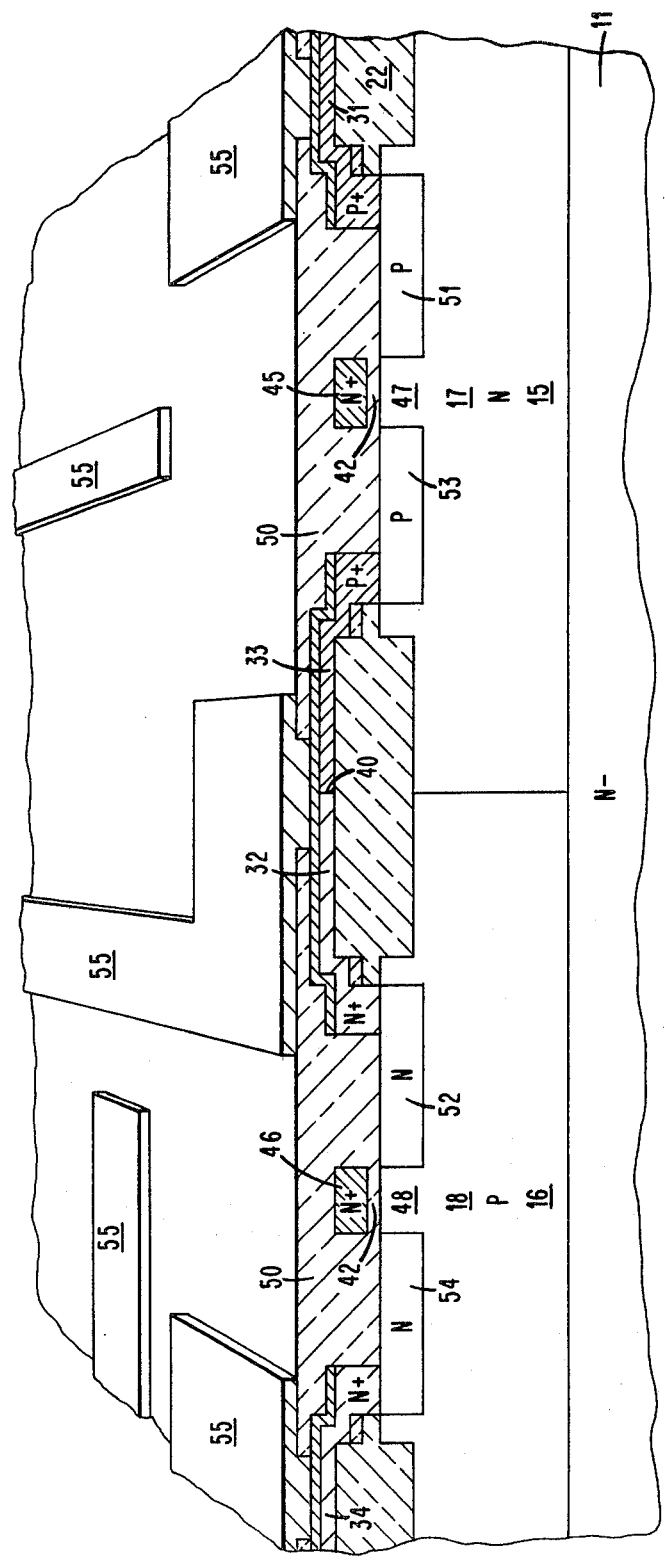

In order to complete the integrated circuit structure, a layer of silicon oxide 50 is deposited over the entire surface to provide a smooth, planar surface as shown in FIG. 4. Openings are formed in the layer 50 to expose selected portions of the underlying metallization of the underlying polycrystalline silicon contact members 31-34 and the underlying polycrystalline silicon gate electrodes 45 and 46. Metal interconnections 55 are then formed by suitable deposition, masking, and etching techniques of a metal, specifically aluminum, to complete the connections to the elements of the integrated circuit.

In integrated circuit structures incorporating CMOS FET's as described the P-type source/drain regions 51 and 53 typically have a resistivity of 60-100 ohms per square and the N-type source/drain regions 52 and 54 have a resistivity of 30-50 ohms per square. The polycrystalline material of the gate electrodes 45 and 46 and of the contact members 31-34 typically is of 50-100 ohms per square resistivity and the metallization over the contact members is of 1-2 ohms per square resistivity.

The method as described provides interconnecting members of polycrystalline silicon of appropriate conductivity type for making ohmic contact to both N and P-type regions. A highly conductive metallized layer shorts out rectifying junctions. Gate electrodes are defined separately from the interconnecting contact members and are subject to close geometical control. The relationship between the gate electrode and the underlying gate insulating material may be closely controlled because there are no processing steps between the deposition of the gate oxide layer and the deposition of the polycrystalline silicon of the gate electrodes. The conductivity type imparting materials for the source/drain regions are implanted after formation of the gate insulating layer and gate electrodes with the gate electrodes defining the width of the channel regions. Tne polycrystalline interconnecting contact members and the refractory metallized high conductivity surface are compatible with subsequent processing to form the smoothing oxide and the final metal interconnections.

While there has been shown and described what is considered a preferred embodiment of the present invention, it will be obvious to those skilled in the art that various changes and modifications may be made therein without departing from the invention as defined by the appended claims.

What is claimed is:

1. The method of fabricating monolithic integrated circuit structure incorporating complementary field effect transistors comprising providing a body of semiconductor material having a first section of one conductivity type and a second section of the opposite conductivity type at a surface of the body with a first sector within said first section and a second sector within said second section covered by an adherent coating of insulating material, the portions of the surface of the body contiguous with said first and second sectors being covered by an adherent field layer of insulating material thicker than the coating of insulating material;

removing portions of said coating of insulating material to form openings exposing first and second spaced apart zones in said first sector and first and second spaced apart zones in said second sector;

forming adherent contact members of semiconductor material of the one conductivity type of low resistivity on the surfaces of the exposed first and second zones in said second sector extending over portions of said adherent coating and field layer of insulating material, and forming adherent contact members of semiconductor material of the opposite conductivity type of low resistivity on the surfaces of the exposed first and second zones in said first sector extending over portions of said adherent coating and field layer of insulating material, one of the contact members of semiconductor material of the one conductivity type being contiguous with one of the contact members of semiconductor material of the opposite conductivity type at a junction;

forming an adherent layer of highy conductive material on and in ohmic contact with the one contact member of semiconductor material of the one conductivity type and on and in ohmic contact with the one contact member of semiconductor material of the opposite conductivity type in the regions of the contact members in which they are contiguous, thereby shorting out the rectifying junction therebetween;

removing the coating of insulating material from said first and second sectors except the portions thereof underlying said adherent contact members of semiconductor material to expose portions of said first and second sectors;

placing an adherent gate layer of insulating material on the exposed portions of said first and second sectors;

placing a first gate member of semiconductor material of low resistivity over a portion of the gate layer of insulating material overlying a channel region of said first sector with said channel region lying between two source/drain regions of said first sector, and a second gate member of semiconductor material of low resistivity over a portion of the gate layer of insulating material overlying a channel region of said second sector with said channel region lying between two source/drain regions of said second sector; and introducing conductivity type imparting material of the opposite conductivity type into said two source/drain regions of said first sector including said first and second zones in said first sector, and introducing conductivity type imparting material of the one conductivity type into said two source/drain regions of said second sector including said first and second zones in said second sector.

2. The method in accordance with claim 1 wherein said body of semiconductor material is of single crystal silicon; and said contact member of semiconductor material of the one conductivity type, said contact member of semiconductor material of the opposite conductivity type, said first gate member of semiconductor material, and said second gate member of semiconductor material are of polycrystalline silicon.

3. The method in accordance with claim 2 wherein said adherent field layer of insulating material, and said adherent gate layer of insulating material are of silicon oxide.

4. The method in accordance with claim 3 wherein introducing conductivity type imparting material of the opposite conductivity type into said two source/drain regions of said first sector includes ion implanting conductivity type imparting material of the opposite conductivity type through the gate layer of insulating material into said first sector except for the portions shielded by said contact members and said first gate member;

introducing conductivity type imparting material of the one conductivity type into said two source/drain regions of said second sector includes ion implanting conductivity type imparting material of the one conductivity type through the gate layer of insulating material into said second sector except for the portions shielded by said contact members and said second gate member; and conductivity type imparting material of the opposite conductivity type is introduced into said first and second zones in said first sector and conductivity type imparting material of the one conductivity type is introduced into said first and second zones in said second sector by heating said body to diffuse conductivity type imparting material from the contact members into the respective adjacent zones.

* * * * *